United States Patent
Shim

(10) Patent No.: US 7,728,351 B2
(45) Date of Patent: Jun. 1, 2010

(54) IMAGE SENSOR AND METHOD FOR MANUFACTURING THE SAME

(75) Inventor: Cheon Man Shim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 37 days.

(21) Appl. No.: 11/967,391

(22) Filed: Dec. 31, 2007

(65) Prior Publication Data

US 2008/0315252 A1 Dec. 25, 2008

(30) Foreign Application Priority Data

Jun. 25, 2007 (KR) .................. 10-2007-0062019

(51) Int. Cl.
- H01L 31/072 (2006.01)
- H01L 31/109 (2006.01)
- H01L 31/0328 (2006.01)
- H01L 31/0336 (2006.01)

(52) U.S. Cl. .................. 257/184; 438/16; 438/31

(58) Field of Classification Search .................. 257/53, 257/59, 184, 431, 432; 438/16, 31, 35, 98
See application file for complete search history.

(56) References Cited

U.S. PATENT DOCUMENTS

| | | | | |
|---|---|---|---|---|
| 5,716,480 A | * | 2/1998 | Matsuyama et al. | 136/249 |
| 6,180,529 B1 | * | 1/2001 | Gu | 438/706 |
| 6,468,829 B2 | * | 10/2002 | Guha et al. | 438/96 |
| 6,778,723 B1 | * | 8/2004 | Yang | 385/16 |
| 6,809,358 B2 | | 10/2004 | Hsieh et al. | |
| 7,112,495 B2 | * | 9/2006 | Ko et al. | 438/300 |
| 2008/0283881 A1 | * | 11/2008 | Lee | 257/292 |
| 2008/0315198 A1 | * | 12/2008 | Jung | 257/53 |

OTHER PUBLICATIONS

G. Wohl, C. Parry, E. Kasper, M. Jutzi and M. Berroth; Second Joint Symposium on opto- and Microelectronic Devices and Circuits, Stuttgart, pp. 77-83 Mar. 10-16, 2002.

IEEE Trandactions on Electron Devices, vol. 45, No. 2, pp. 538-542.

Shu Bin, Zhang He-Ming, Ren Dong-Ling, Wang Wei, Simulation Study of Electrical Properties of CMOS Based on Strained Si/Si Ge, China, May 2007.

* cited by examiner

*Primary Examiner*—Phuc T Dang
(74) *Attorney, Agent, or Firm*—Sherr & Vaughn, PLLC

(57) ABSTRACT

An image sensor provides enhanced integration of transistor circuitry and photo diodes. The image sensor simultaneously improves resolution and sensitivity. An image sensor an a method for manufacturing prevents defects in a photo diode by adopting a vertical photo diode structure. An image sensor includes a substrate which may include at least one circuit element. A bottom electrode and a first conductive layer may be sequentially formed over the substrate. A strained intrinsic layer may be formed over the first conductive layer. A second conductive layer may be formed over the strained intrinsic layer. An upper electrode may be formed over the second conductive layer.

17 Claims, 4 Drawing Sheets

IMAGE SENSOR AND METHOD FOR MANUFACTURING THE SAME

Figure 1:
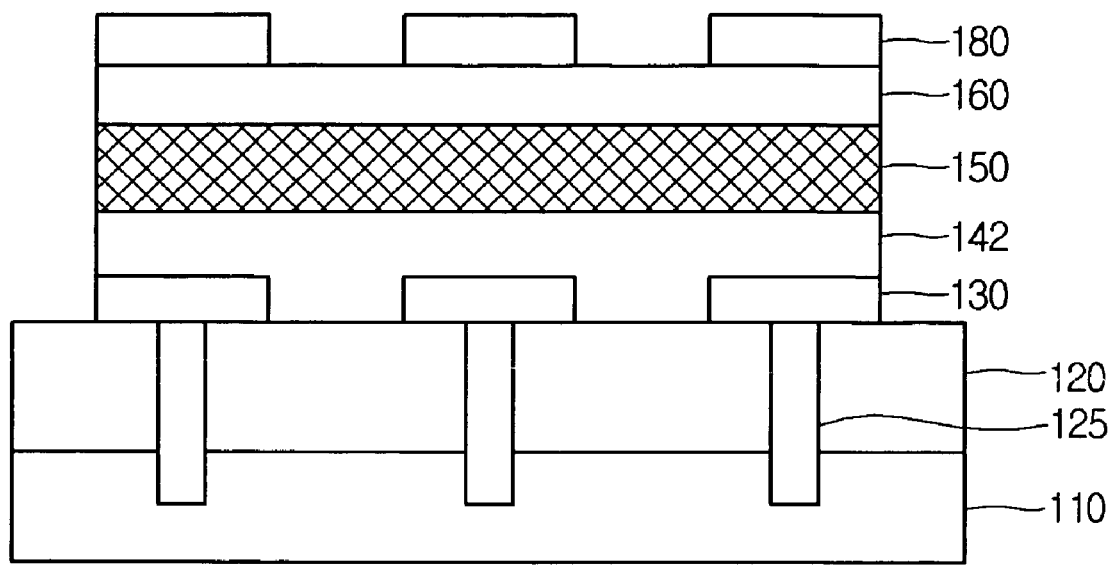

The present application claims priority under 35 U.S.C. 119 to Korean Patent Application No. 10-2007-0062019, filed on Jun. 25, 2007, which is hereby incorporated by reference in its entirety.

BACKGROUND

Image sensors, which are semiconductor devices for converting an optical image into an electrical signal, may be categorized as charge coupled device (CCD) image sensors and complementary metal oxide silicon (CMOS) image sensors.

CCDs have disadvantages. These include complicated driving requirements, relatively high power consumption, and a complicated manufacturing process which requires a multi-stage photolithography process. As a next generation image sensor for overcoming the disadvantages of CCDs, CMOS image sensors have attracted interest.

CMOS image sensors use a photo diode and a MOS transistor in each unit pixel. Images are detected by sequentially detecting the electrical signals from each unit pixel. CMOS image sensors according to the related art can be divided into a photo diode region for receiving light signals and changing them into electrical signals, and a transistor region for processing the electrical signals. However, the CMOS image sensor according to the related art uses a structure having the photo diode horizontally arranged with the transistor.

So while the disadvantages of the CCD image sensor have been reduced by the horizontal type CMOS image sensor, the horizontal type CMOS image sensor according to the related art still has problems. In other words, in the planar CMOS image sensor according to the related art, the photo diode and the transistor are manufactured to be horizontally adjacent to each other on the substrate. Accordingly, additional area is required to accommodate both the photo diode and the transistor. As a result, fill factor (the percentage of the area filled by photosensitive regions) may be reduced, and higher resolutions may be limited.

In the planar CMOS image sensor according to the related art, it is very difficult to simultaneously optimize the manufacturing processes of the photo diode and the transistor. For example, in the transistor process, a shallow junction for low sheet resistance is required; however, in the photo diode process, such a shallow junction may not be proper.

In a planar CMOS image sensor according to the related art, as additional on-chip functions are integrated onto the image sensor, the size of the unit pixel may be increased for maintaining the photosensitivity of the image sensor, or the area for the photo diode may be reduced for maintaining a pixel size. If the unit pixel size is increased the resolution of the image sensor is reduced. If the area of the photo diode is reduced to maintain unit pixel size, the photosensitivity of the image sensor is reduced.

SUMMARY

Embodiments relate to an image sensor capable of providing enhanced integration of transistor circuitry and photo diodes. Embodiments relate to an image sensor and a method for manufacturing the same, capable of maximizing response and efficiency by improving mobility. Embodiments relate to an image sensor and a method for manufacturing the same, capable of simultaneously improving resolution and sensitivity. Embodiments relate to an image sensor and a method for manufacturing the same, capable of preventing defects in a photo diode by adopting a vertical photo diode structure.

Embodiments relate to an image sensor which includes a substrate which may include at least one circuit element. A bottom electrode and a first conductive layer may be sequentially formed over the substrate. A strained intrinsic layer may be formed over the first conductive layer. A second conductive layer may be formed over the strained intrinsic layer. An upper electrode may be formed over the second conductive layer.

Embodiments relate to an image sensor which includes a substrate which may include at least one circuit element. A bottom electrode may be formed over the substrate. a silicon-germanium intrinsic layer (SiGe intrinsic layer) may be formed over the bottom electrode. A second conductive layer may be formed over the silicon-germanium intrinsic layer (SiGe intrinsic layer). An upper electrode may be formed over the second conductive layer.

Embodiments relate to a method for manufacturing an image sensor including sequentially forming a bottom electrode and a first conductive layer over a substrate including at least one circuit element. The process includes forming a strained intrinsic layer over the first conductive layer and forming a second conductive layer over the stained intrinsic layer. The process includes forming an upper electrode over the second conductive layer.

DRAWINGS

Example FIG. 1 is a cross-sectional view of an image sensor according to embodiments.

Figure 2A:
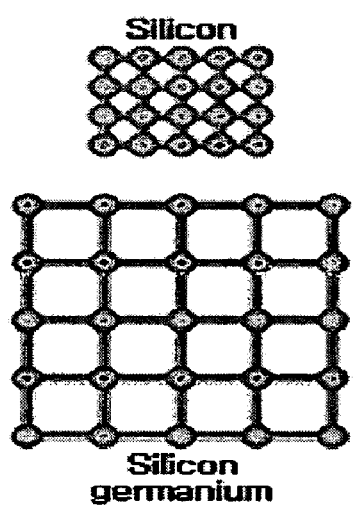
Figure 2B:
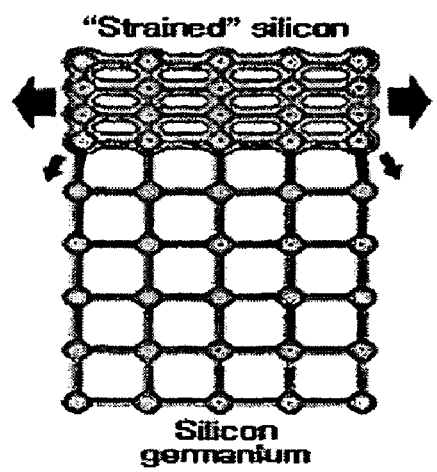

Example FIGS. 2A and 2B are photographs for explaining the mechanism of the image sensor according to embodiments.

Figure 3:
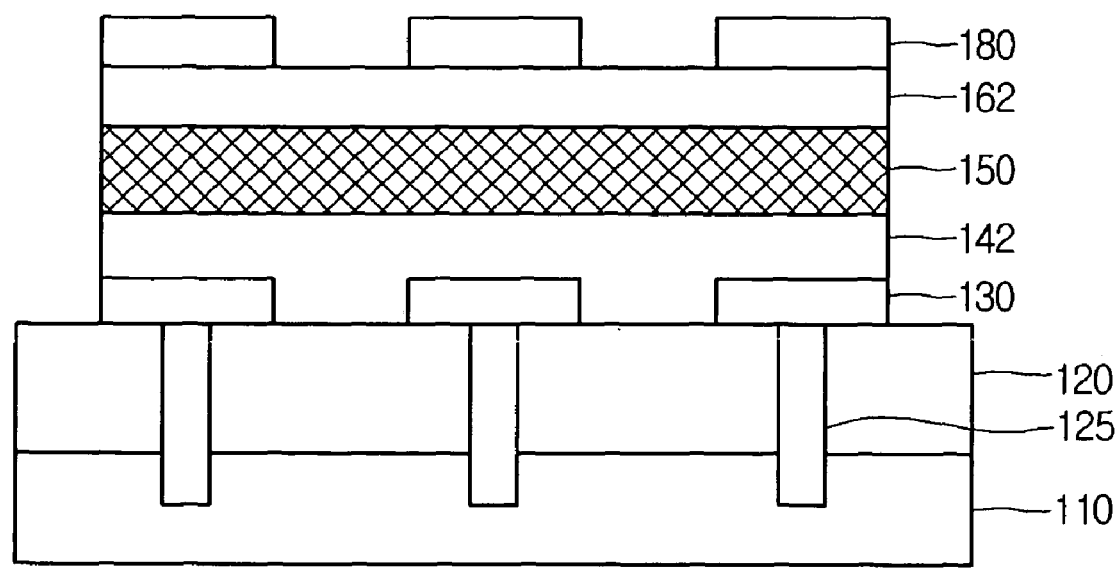

Example FIG. 3 is a cross-sectional view of an image sensor according to embodiments.

Figure 4:
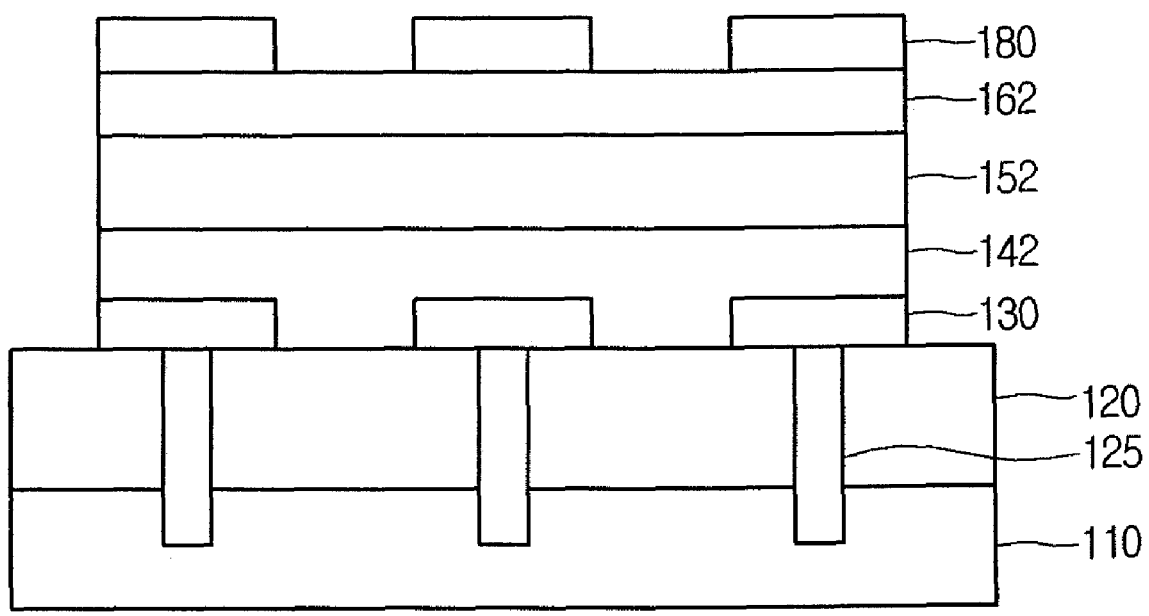

Example FIG. 4 is a cross-sectional view of an image sensor according to embodiments.

Figure 5:
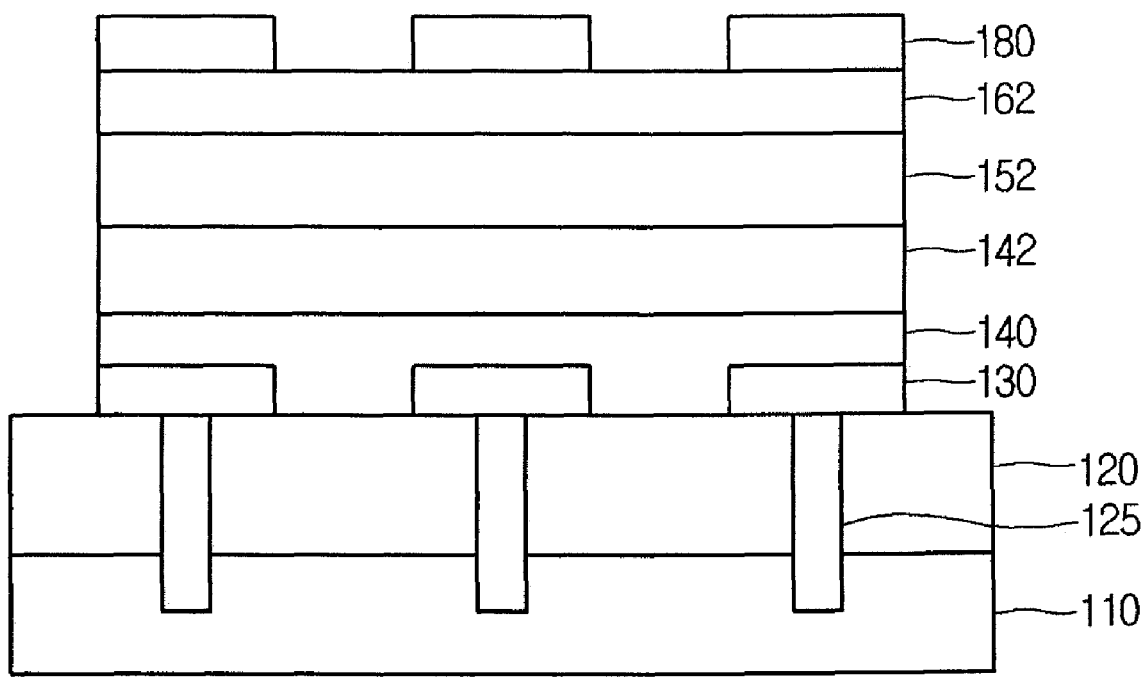

Example FIG. 5 is a cross-sectional view of an image sensor according to embodiments.

DESCRIPTION

Example FIG. 1 is a cross-sectional view of an image sensor according to embodiments. The image sensor according to embodiments includes: a substrate 110 including at least one circuit element. A bottom electrode 130 and a first conductive layer 142 may be sequentially formed over the substrate 110. A strained intrinsic layer 150 may be formed over the first conductive layer 142. A second conductive layer 160 may be formed over the strained intrinsic layer 150. An upper electrode 180 may be formed over the second conductive layer 160. The first conductive layer 142 may be a first conductive type, and the second conductive layer 160 may be a second conductive type. Here, the first conductive type may be opposite to the second conductive type.

In embodiments, an interlayer insulating layer 120 and a metal wiring 125 can further be formed over the substrate 110. Thereafter, a bottom electrode 130 can be formed over the metal wiring 125. The bottom electrode 130 can be formed of various conductive materials including, for example, metal, alloy or silicide. For example, the bottom electrode 130 can comprise a metal such as Cr, Ti, TiW, and Ta, etc., which can easily form a silicide, using a PVD method, etc.

In an image sensor according to embodiments, the first conductive silicon-germanium (SiGe) 142 may be deposited over the lower of the silicon intrinsic layer (a-Si:H) 150 so that the strained silicon intrinsic layer (strained a-Si:H) 150 is formed to improve mobility, making it possible to maximize response and efficiency. For example, the first conductive layer 142 may be a first conductive silicon-germanium layer 142.

The first conductive layer 142 can perform the function of the N-layer of a PIN diode adopted in embodiments. In other words, the first conductive layer 142 may be the n-type conductive layer, however, it is not limited thereto. The first conductive layer 142 can be formed in a-SiGe:H by adding germanium (Ge) into amorphous silicon (Si). The first conductive layer 142 can be formed by a chemical vapor deposition (CVD) method, in particular, a PECVD (Plasma Enhanced CVD) method, etc. The first conductive silicon-germanium layer 142 may be poly-SiGe or amorphous-SiGe.

Next, an intrinsic layer 150 may be formed over the substrate 110 including the first conductive layer 142. The intrinsic layer 150 may perform the function of I-layer of a PIN diode adopted in embodiments. The intrinsic layer 150 may be formed using amorphous silicon. The intrinsic layer 150 may be formed by a chemical vapor deposition (CVD) method, in particular, a PECVD method, etc. For example, the intrinsic layer 150 can be formed of amorphous silicon using silane gas (SiH4), etc., by means of the PECVD method. A strained intrinsic layer 150 may be smaller than the first conductive layer 142 in view of the lattice constant. For example, the strained intrinsic layer 150 may be a strained silicon intrinsic layer 150.

Example FIGS. 2A and 2B illustrate principles of the image sensor according to embodiments. Since the atomic lattice interval of Ge is larger than that of Si by about 4.2% as shown in example FIG. 2A, when Si is deposited over SiGe (SiGe means $Si_xGe_y$, wherein x+y=1) having a wide lattice interval as shown in example FIG. 2B, the lattice interval of the original Si becomes large, and the silicon becomes strained silicon. Since the lattice interval of the silicon is wide, electrons are liable to be processed, not colliding with atoms, so that mobility of electrons is improved.

Even when the crystal structure of the intrinsic layer 150 is mixed amorphous and crystalline, the portions of the intrinsic layer 150 with an amorphous structure will have the same characteristics as the portions of the intrinsic layer 150 with a crystalline structure. Also, in embodiments, the silicon (a-Si:H) has a bandgap of about 1.9 eV, but the SiGe has a bandgap below 1.9 eV depending on the content of Ge so that a photocurrent can be obtained below a visible region, making it possible to observe things even in the darkness, without visible light.

Next, the second conductive layer 160 is formed over the strained silicon intrinsic layer 150. The second conductive layer 160 can be formed in a continuous process to the formation of the intrinsic layer 150. The second conductive layer 160 can perform the function of the P-layer of a PIN diode adopted in embodiments. In other words, the second conductive layer 160 may be a p-type conductive layer, however, it is not limited thereto.

The second conductive layer 160 may be formed using P-doped amorphous silicon, however, it is not limited thereto. The second conductive layer 160 may be formed by means of a chemical vapor deposition (CVD) method, in particular, a plasma-enhanced chemical vapor deposition (PECVD) method, etc. For example, the second conductive layer 160 can be formed of amorphous silicon by adding boron, etc. into silane gas ($SiH_4$) by means of the PECVD method.

Thereafter, the upper electrode 180 is formed over the second conductive layer 160. The upper electrode 180 can be formed of a substantially transparent material having high conductivity and high transmittance of light. For example, the upper transparent electrode 180 may be formed of indium tin oxide (ITO) or cadmium tin oxide (CTO), etc.

The image sensor according to the first embodiment deposits the silicon-germanium (SiGe) over the lower of the silicon intrinsic layer (a-Si:H) to make the strained silicon (strained a-Si:H) so that the mobility is improved, making it possible to maximize response and efficiency. In other words, the intrinsic a-Si:H is deposited over the n-type SiGe so that the strained silicon intrinsic layer (strained intrinsic a-Si:H) is formed. Accordingly, the electrons generated from the intrinsic layer by impinging light are rapidly moved to the n-type SiGe area. This maximizes quantum efficiency by reducing the probability that the electron/hole pairs recombine and disappear.

An image sensor according to embodiments includes a substrate 110 including at least one circuit element. A bottom electrode 130 and a first conductive layer 142 may be sequentially formed over the substrate 110. A strained intrinsic layer 150 may be formed over the first conductive layer 142. A second conductive layer may be formed over the strained intrinsic layer 150. An upper electrode 180 may be formed over the second conductive layer 162.

Example FIG. 3 is a cross-sectional view of an image sensor according to embodiments. Embodiments may adopt the technical characteristics of previously described embodiments. However, in embodiments, the second conductive layer may be the second conductive silicon-germanium layer 162. For example, differently from other embodiments, the second conductive silicon-germanium layer 162 is formed over the strained intrinsic layer 150 so that the lattice interval of the strained intrinsic layer 150 is narrowed, making it possible to improve the mobility of the holes. In other words, as shown in example FIG. 3, embodiments may have a structure using a p-type SiGe layer 162 as the second conductive layer so that the holes generated from the strained intrinsic layer 150 may easily escape to the upper electrode 180.

The image sensor according to the third embodiment includes a substrate 110 including at least one circuit element. A bottom electrode 130 and a first conductive layer 142 may be sequentially formed over the substrate 110. A silicon-germanium intrinsic layer (SiGe intrinsic layer) 152 may be formed over the first conductive layer 142. A second conductive layer 162 may be formed over the silicon-germanium intrinsic layer (SiGe intrinsic layer) 152. An upper electrode 180 may be formed over the second conductive layer 162.

Example FIG. 4 is a cross-sectional view of an image sensor according to embodiments. Embodiments may adopt the basic technical characteristics of the embodiments described previously. However, in contrast to other embodiments, some embodiments may use a silicon-germanium intrinsic layer 152 having a wide lattice constant as the intrinsic layer. Also, in contrast to other embodiments, the second conductive layer may be the second conductive silicon-germanium layer 162 in embodiments according to example FIG. 4. The first conductive layer 142 may also be the first conductive silicon-germanium layer 142. In other words, in embodiments according to example FIG. 4, a structure may apply poly-SiGe, which has excellent mobility, to the whole layers. In this case, the first conductive silicon-germanium layer 142 may not be formed.

Example FIG. 5 is a cross-sectional view of an image sensor according to embodiments. As shown in example FIG. 5, the image sensor according to embodiments includes a substrate 110 including at least one circuit element. A bottom electrode 130 and a first conductive layer 142 may be sequentially formed over the substrate 110. A silicon-germanium intrinsic layer (SiGe intrinsic layer) 152 may be formed over the first conductive layer 142. A second conductive layer 162 may be formed over the silicon-germanium intrinsic layer (SiGe intrinsic layer) 152. An upper electrode 180 may be formed over the second conductive layer 162.

Embodiments according to example FIG. 5 may adopt the technical characteristics of embodiments according to example FIG. 4. However, in contrast to embodiments according to example FIG. 4, embodiments according to example FIG. 5 may further include the first conductive silicon layer 140 formed between the bottom electrode 130 and the first conductive layer 142. In other words, embodiments may further form the first conductive silicon layer (n-type a-Si:H) 140 over the lower thereof to obtain an excellent poly-crystalline structure of the SiGe intrinsic layer 152.

The image sensor and the method for manufacturing the same according to embodiments may provide a structure where transistor circuitry and a photo diode are vertically integrated. Also, with embodiments as described above, a silicon-germanium (SiGe) may be deposited over the lower of the silicon intrinsic layer (a-Si:H) so that the strained silicon (strained a-Si:H) is formed to improve mobility, making it possible to maximize response and efficiency. A silicon-germanium (SiGe) intrinsic layer having wide lattice interval may be formed instead of the silicon intrinsic layer (a-Si:H) so that the mobility of electrons is improved. Since the poly SiGe may be made at a temperature where metallization is possible, characteristics may be further improved. SiGe with a low bandgap may be used so that an image can be obtained in the darkness. The fill factor can approach 100% with vertical integration of transistor circuitry and the photo diode. Higher sensitivity compared to the related art may be provided with the same pixel size by means of the vertical integration. The manufacturing costs thereof may be reduced as compared to the related art for the same resolution. More complicated circuit may be implemented in an image sensor without reducing sensitivity of each unit pixel. Additional on-chip circuitry may be integrated to improve performance of the image sensor. This may also aid reduction of manufacturing costs and miniaturization of the device. Adopting the vertical photo diode structure may also be prevent defects in the photo diode.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a substrate including at least one circuit element;
a bottom electrode and a first conductive layer sequentially formed over the substrate;
a strained intrinsic layer formed over the first conductive layer;
a second conductive layer formed over the strained intrinsic layer; and
an upper electrode formed over the second conductive layer.

2. The apparatus of claim 1, wherein the first conductive layer is a first conductive silicon-germanium layer.

3. The apparatus of claim 1, wherein the strained intrinsic layer is a strained silicon intrinsic layer.

4. The apparatus of claim 3, wherein the second conductive layer is a second conductive silicon layer.

5. The apparatus of claim 3, wherein the second conductive layer is a second conductive silicon-germanium layer.

6. The apparatus of claim 1, wherein the upper electrode is transparent.

7. The apparatus of claim 1, wherein the upper electrode is formed of one of indium tin oxide and cadmium tin oxide.

8. The apparatus of claim 1, wherein the layers collectively comprise components of a CMOS image sensor.

9. An apparatus comprising:
a substrate including at least a first circuit element;
a bottom electrode formed over the substrate;
a first conductive silicon layer formed over the bottom electrode;
a silicon-germanium intrinsic layer formed over the first conductive silicon layer;
a second conductive layer formed over the silicon-germanium intrinsic layer; and
an upper electrode formed over the second conductive layer.

10. The apparatus of claim 9, further comprising a first conductive silicon-germanium layer formed over the bottom electrode.

11. The apparatus of claim 9, wherein the second conductive layer is a second conductive silicon-germanium layer.

12. The apparatus of claim 9, wherein the upper electrode is transparent.

13. A method comprising:
sequentially forming a bottom electrode and a first conductive layer over a substrate including at least one circuit element;
forming a strained intrinsic layer over the first conductive layer;
forming a second conductive layer over the strained intrinsic layer; and
forming an upper electrode over the second conductive layer,
wherein the lattice constant for the strained intrinsic layer is smaller than the lattice constant for the first conductive layer.

14. The method of claim 13, wherein the first conductive layer is a first conductive silicon-germanium layer.

15. The method of claim 14, wherein the strained intrinsic layer is a strained silicon intrinsic layer.

16. The method of claim 13, wherein the strained intrinsic layer is a strained silicon intrinsic layer.

17. The method of claim 13, wherein the upper electrode is transparent.

* * * * *